United States Patent
Sakata

(10) Patent No.: US 7,300,882 B2
(45) Date of Patent: Nov. 27, 2007

(54) ETCHING METHOD AND SEMICONDUCTOR DEVICE FABRICATING METHOD

(75) Inventor: Toyokazu Sakata, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 185 days.

(21) Appl. No.: 10/721,260

(22) Filed: Nov. 26, 2003

(65) Prior Publication Data
US 2004/0242011 A1     Dec. 2, 2004

(30) Foreign Application Priority Data
May 27, 2003   (JP) ............................. 2003-149057

(51) Int. Cl.
    *H01L 21/302*   (2006.01)
(52) U.S. Cl. .................. 438/714; 438/700; 438/701; 438/702; 438/690; 438/694; 216/18
(58) Field of Classification Search ............... 438/706, 438/710, 712, 714, 729; 216/58, 67, 68
    See application file for complete search history.

(56) References Cited

U.S. PATENT DOCUMENTS

| | | | |
|---|---|---|---|
| 4,931,144 A * | 6/1990 | Brighton ................. | 174/262 |
| 6,355,572 B1 | 3/2002 | Ikegami | |
| 6,716,749 B2 * | 4/2004 | Noguchi et al. ........... | 438/677 |
| 6,897,154 B2 * | 5/2005 | Leung et al. ............. | 438/706 |
| 2003/0008511 A1 * | 1/2003 | Tsai et al. .............. | 438/694 |
| 2003/0024902 A1 * | 2/2003 | Li et al. ................ | 216/67 |
| 2003/0181034 A1 * | 9/2003 | Jiang et al. ............ | 438/638 |

FOREIGN PATENT DOCUMENTS

| | | |
|---|---|---|
| JP | 7-94483 | 4/1995 |
| JP | 2001-77086 | 3/2001 |

OTHER PUBLICATIONS

Lin et al.; An Optimized Integration Scheme for 0.13 um Technology Node Dual-Damascene Cu Interconnect; 0-7803-6327—Feb. 2000 © 2000 IEEE.*
Lin et al.; An Optimized Integration Scheme for 0.13 um Technology Node Dual-Damascene Cu Interconnect; 0-7803-6327-2/00 © 2000 IEEE.*
"Dry Etching of Organic Low Dielectric Constant Film without Etch Stop Layer" M.Mizumura et al. JJAP, vol. 41, pp. 425-427, no date.
"Highly Selective Etching of Organic SOG to SiN for Cu Damascene Interconnects Using New Gas Chemistry of $C_4F_8$/ $N_2$ /Ar" S. Uno et al. Proc. Of Dry Process Symp., pp. 215-220(1999).

* cited by examiner

*Primary Examiner*—Nadine G. Norton
*Assistant Examiner*—Patricia A. George
(74) *Attorney, Agent, or Firm*—Rabin & Berdo, PC

(57) ABSTRACT

An etching method for plasma-etching a low-k film, wherein the plasma etching is conducted under an etching gas atmosphere including a fluorocarbon gas, $O_2$ gas and Ar gas, and under the conditions of a pressure of 60 mTorr (7999.32 mPa) or higher and a high-frequency output (RF power) of 600 W or less.

14 Claims, 3 Drawing Sheets

F I G . 1
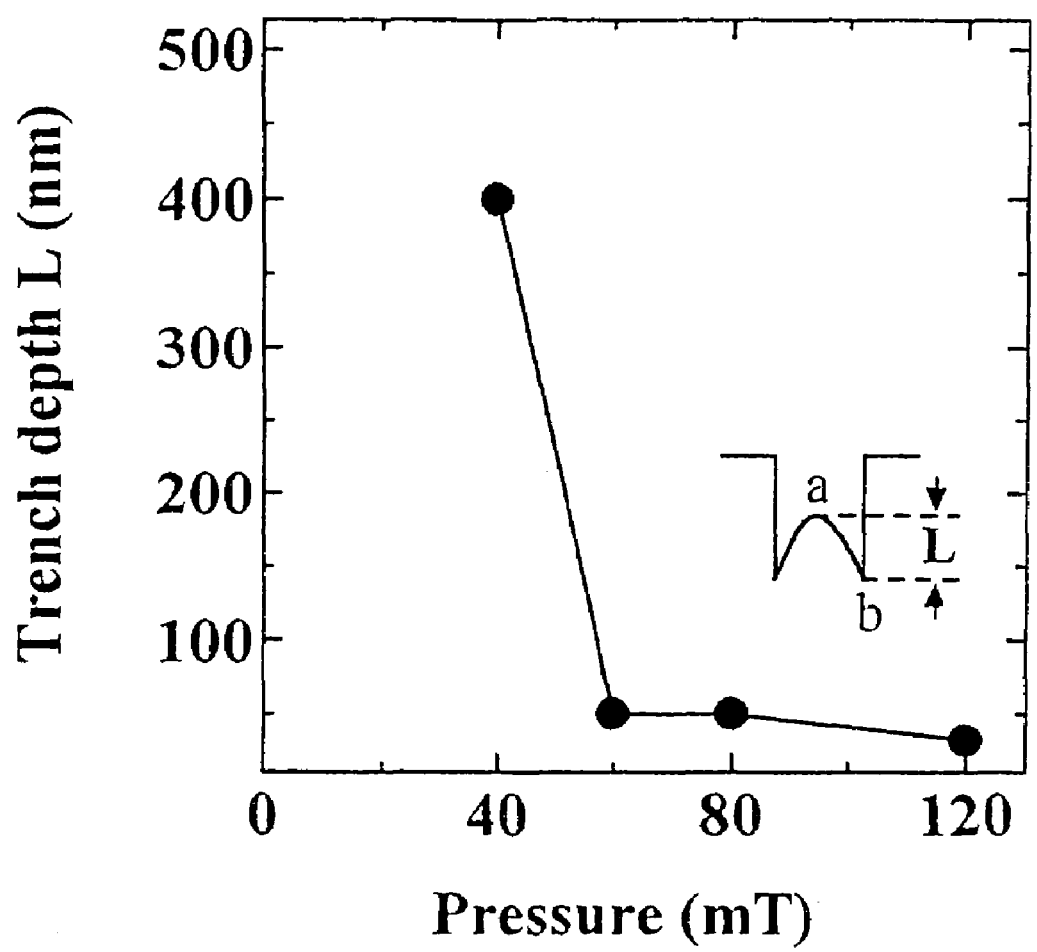

F I G. 2
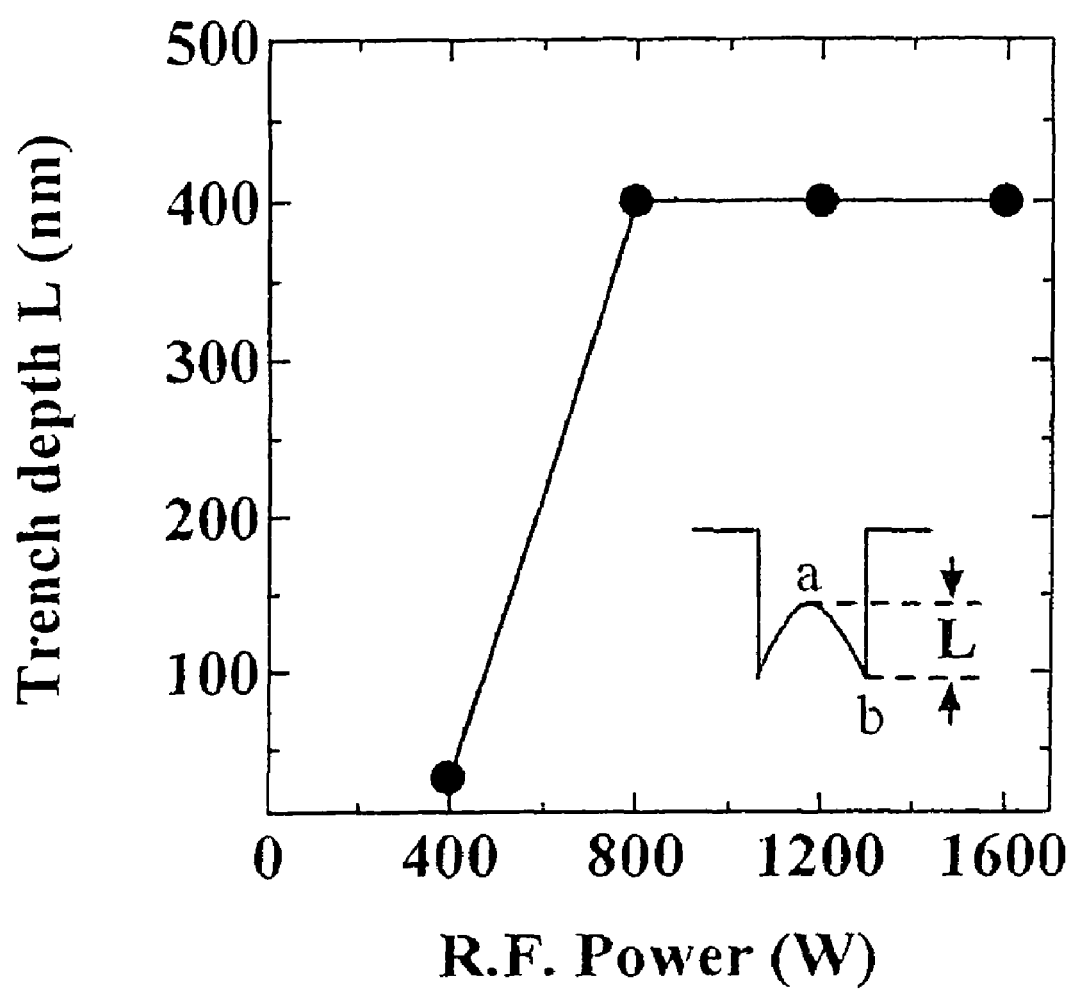

US 7,300,882 B2

ETCHING METHOD AND SEMICONDUCTOR DEVICE FABRICATING METHOD

CROSS-REFERENCE TO RELATED APPLICATION

This application claims priority under 35USC 119 from Japanese Patent Application No. 2003-149057, the disclosure of which is incorporated by reference herein.

BACKGROUND OF THE INVENTION

1. Field of the Invention

The present invention relates to an etching method for forming a via hole or interconnection groove in a low-k film (an insulating film having a low dielectric constant) used in a multilayer interconnection structure of a semiconductor integrated circuit, and to a semiconductor device fabricating method using this etching method.

2. Description of the Related Art

In recent years, as the miniaturization of semiconductor devices advance, the importance of multilayer interconnection technology has been increasing in addition to the importance of the miniaturization of transistors. Additionally, it is becoming increasingly important to reduce interconnect delay in multilayer interconnection. As one method of reducing interconnect delay in multilayer interconnection, it is known that a low-k film can be effectively used in place of the oxidation film that has been used up to this point as an interlayer insulating film.

However, in a case where a low-k film (here, an organic SOG film) is used as an interlayer insulating film, the etching shape of a hole pattern bottom portion changes to a shape called a trench where etching speeds at the center and at the end of a pattern greatly differ.

In this trench, since etching progresses more rapidly at the bottom end of a pattern than at the center of the pattern, it is difficult to stop the etching at a desired depth even if an etch stop layer is used. For this reason, problems arise in that, at the pattern end portion where the etching speed is high, the etch stop layer is pierced and underlayer interconnection (e.g., copper interconnection) is exposed to plasma, and in an etching condition including oxygen, the surface of the copper interconnection is oxidized and contact resistance rises.

In addition, because the trench of the pattern bottom portion forms minute slits, these slit portions may not be covered by a barrier film such as Ta and TaN used as a copper diffusion-preventing film. When portions not covered by the barrier film are present, copper diffuses from those portions, which can cause a short circuit with adjacent interconnection and exert a large influence on transistor properties (see M. Mizumura et al., *JJAP*, Vol. 41, pp. 425–427; and S. Uno et al., *Proc. of Dry Process Symp.*, pp. 215–220 (1999)).

In order to solve this problem, Japanese Patent Application Laid-Open Publication (JP-A) No. 2001-077086 discloses an etching method where the mixing ratio ($O_2/(C_4F_8+O_2)$) of a mixed gas of $C_4F_8$ and $O_2$ serving as an etching gas is controlled, the etching speed of an organic SOG film is improved and the etching shape (via hole shape) of a hole pattern bottom portion is stabilized.

In JP-A 2001-077086, a stable etching shape (via hole shape) of the hole pattern bottom portion can be created. However, technical demands of recent years continue to escalate. Moreover, the current state of affairs is one in which improvements are being anticipated.

SUMMARY OF THE INVENTION

The present invention is devised in order to solve the above-described conventional problems and achieve the following object. Namely, it is an object of the present invention to provide an etching method that stabilizes the etching shape of a low-k film and a semiconductor device fabricating method using this etching method.

This is achieved by the following means.

Namely, an etching method of the invention is characterized in that plasma etching is conducted under an etching gas atmosphere including a fluorocarbon gas, $O_2$ gas and Ar gas, and under the conditions of a pressure of 60 mTorr (7999.32 mPa) or higher and a high-frequency output (RF power) of 600 W or less.

A semiconductor device fabricating method of the invention is characterized in that the above-described etching method of the invention is applied during an etching step for plasma-etching an interlayer insulating film comprising a low-k film. Specifically, in a semiconductor device fabricating method including the steps of: forming a first interconnection; forming a low-k film as an interlayer insulating film on the first interconnection; forming a contact hole in the interlayer insulating film comprising the low-k film, for electrically connecting the first interconnection and the second interconnection; and forming an interconnection groove for embedding the second interconnection in the interlayer insulating film comprising the low-k film, the etching method of the invention is applied to at least one of the hole forming step and the interconnection groove forming step.

In the invention, the fluorocarbon gas preferably includes at least one selected from the group consisting of $C_4F_8$, $C_5F_8$, $C_4F_6$ and $C_3F_6$.

In the invention, the low-k film is preferably one selected from the group consisting of an organic SOG film, an SiOC film and a pure organic film.

In the invention, the semiconductor device may have a structure where an etch stop layer is not formed under the interlayer insulating film comprising the low-k film.

BRIEF DESCRIPTION OF THE DRAWINGS

FIG. 1 is a diagram showing the relationship between etching pressure and the depth of a trench generated in a via hole pattern bottom portion;

FIG. 2 is a diagram showing the relationship between RF power and the depth of a trench generated in a via hole pattern bottom portion.

DETAILED DESCRIPTION OF THE INVENTION

Figure 3A:
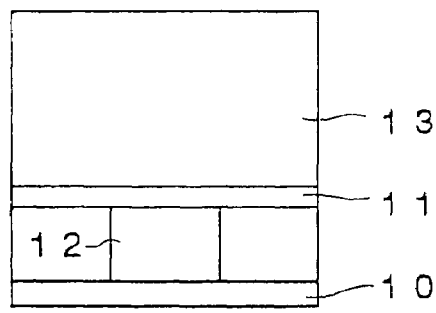
FIGS. 3A to 3F are process diagrams showing a semiconductor device fabricating method representing a second embodiment of the invention.

Examples of embodiments of the invention will be described below with reference to the drawings when appropriate. It should be noted that the same reference numerals will be given throughout the drawings to elements having substantially the same functions and that description thereof may be omitted.

(First Embodiment)

In a first embodiment, a magnetron reactive ion etching device (RIE device) is prepared, a substrate having a low-k film (an insulating film having a low dielectric constant) is placed therein, and the low-k film is plasma-etched to form a hole.

With respect to the etching conditions, the plasma etching is conducted under an etching gas atmosphere including a fluorocarbon gas, $O_2$ gas and Ar gas, and under the conditions of a pressure of 60 mTorr (7999.32 mPa) or higher and a high-frequency output (RF power) of 600 W or less. When plasma etching is administered under these conditions to form a hole in the low-k film, the generation of a trench in the hole pattern bottom portion can be suppressed and stabilization of the etching shape can be achieved.

The etching pressure should be 60 mTorr (7999.32 mPa) or higher, it is preferably 60 to 120 mTorr (7999.32 to 15998.64 mPa) and more preferably 60 to 70 mTorr (7999.32 to 9332.54 mPa). The high-frequency output (RF power) should be 600 W or less, it is preferably 400 to 600 W and more preferably 500 to 600 W.

Examples of the fluorocarbon gas used in the etching include $C_4F_8$, $C_5F_8$, $C_4F_6$ and $C_3F_6$. From the standpoint of achieving a balance between etching grade and processing shape, it is preferable to use $C_4F_8$. These fluorocarbon gases may be used singularly or in combinations of two or more.

The ratio of $O_2$ to a combined amount of the fluorocarbon gas and $O_2$ (the $O_2$/(fluorocarbon+$O_2$) mixing ratio) is preferably 20 to 50% from the standpoint of stabilizing the etching shape, more preferably 20 to 30%, and even more preferably 20 to 25%.

The low-k film can be selected from the group consisting of an organic SOG film, an SiOC film and a pure organic film. Here, the pure organic film refers to an organic film that does not include Si but includes, as main components thereof, C, O and H.

FIG. 1 shows the relationship between etching pressure and the depth of a trench generated in the via hole pattern bottom portion when a via hole is formed in the organic SOG film by conducting plasma etching while varying etching pressure under the conditions of the etching gas (mixed gas of $C_4F_8$/$O_2$/Ar [mixing ratio: 15/5/500 sccm]) and an RF power of 1200 W. In FIG. 1, a trench depth L refers to the depth from a trench center (a) to an end portion (via hole bottom portion) (b).

As shown in FIG. 1, when the etching pressure is 60 mT or higher under a condition that the etching gas and the RF power of 1200 W are constant, the trench depth L is suppressed to about 50 nm.

Similarly, FIG. 2 shows the relationship between RF power and the depth of a trench generated in the via hole pattern bottom portion when a via hole is formed in the organic SOG film by conducting plasma etching while varying the RF power under the conditions of the etching gas (mixed gas of $C_4F_8$/$O_2$/Ar [mixing ratio: 15/5/500 sccm]) and an etching pressure of 40 mTorr (5332.88 mPa).

As shown in FIG. 2, the trench is suppressed at RF power of 800 W or less under a condition that the etching gas and the etching pressure of 40 mTorr are constant. The trench depth L is suppressed to 10 to 20 nm at RF power of 400 W or less.

In this manner, in the present embodiment it becomes possible to suppress the trench generated in the hole pattern bottom portion simply by using a specific etching gas and controlling the pressure and RF power as the etching conditions, whereas conventionally the type and mixing ratio of the etching gas are controlled as the etching conditions. Specifically, it is possible to suppress the trench depth to, for example, 30 nm or less under an etching gas atmosphere including a fluorocarbon gas, $O_2$ gas and Ar gas, under an etching pressure of 60 mT or higher and RF power of 600 W or less; i.e., high pressure and low RF power conditions.

Although the reason for this achievement is not entirely understood, it is believed to be as follows. The following two points are thought of as trench generating mechanisms. One is a mechanism where, when an etched reaction product is again made incident and deposited, a trench is generated in the hole pattern end portion since the etched reaction product deposits more thinly at the vicinity of the hole pattern end portion than at the center portion. The other is a mechanism where ions that are made incident from the plasma are reflected on an etched side wall and those ions are concentrated at the hole pattern bottom end portion, whereby a trench is generated.

Therefore, it is thought that the evenness of the reaction product deposited at the pattern bottom portion is improved by raising pressure during etching, and that ions reflected by the side wall can be deterred from concentrating at the hole pattern bottom end portion by lowering RF power, to thereby suppress trench generation. It is also thought that, by so doing, etching speeds at the bottom portion center and the end portion of the hole pattern become constant.

It should be noted that, although an embodiment where a hole such as a via hole is formed in the low-k film has been described here, the same effect can also be provided in a case where, for example, a groove such as an interconnection groove is formed.

(Second Embodiment)

FIGS. 3A to 3F are process diagrams showing a semiconductor device fabricating method representing a second embodiment of the invention.

The present embodiment is one where the first embodiment is applied to a method of fabricating a semiconductor device having a dual damascene structure without an etching stopper where an etch stop layer is not formed under an interlayer insulating film comprising a low-k film (an interlayer insulating film is formed on a layer different from an etch stop layer).

Figure 3B:
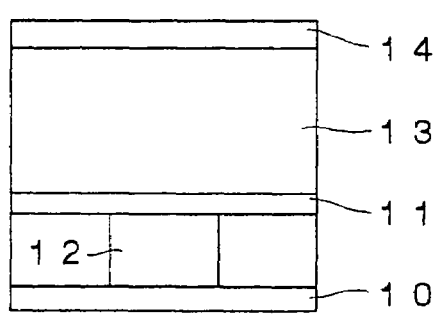
Figure 3C:
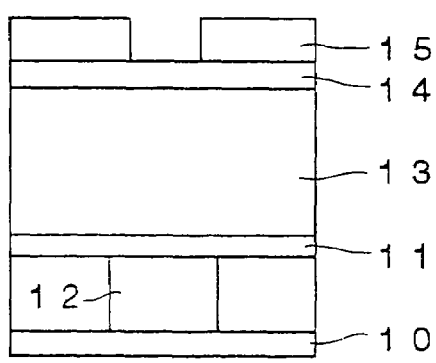
Figure 3D:
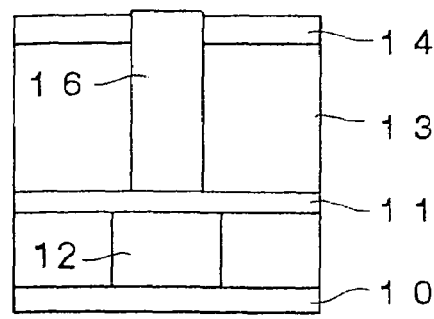
Figure 3E:
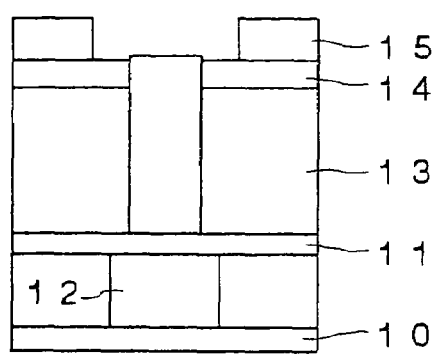
Figure 3F:
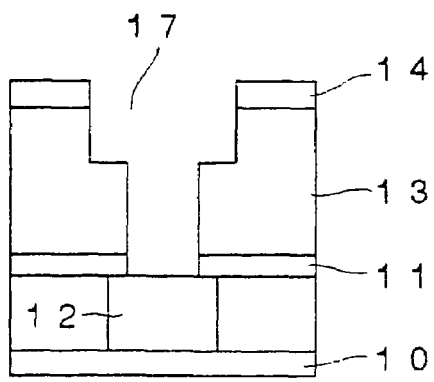

Specifically, Cu interconnection 12 (first interconnection) is formed on a lower insulating film 10, and then a silicon nitride film (diffusion-preventing film) 11 is formed on the Cu interconnection layer 12. Thereafter, a low-k film 13 is formed as an interlayer insulating film on the silicon nitride film 11 (FIG. 3A). Next, a cap oxidation film (diffusion-preventing film) 14 is formed on the low-k film 13 (FIG. 3B). Next, a photoresist film 15 is coated on the cap oxidation film 14 and patterning for a via hole is conducted using a photolithographic technique (FIG. 3C). Thereafter, the cap oxidation film 14 and the low-k film 13 are etched together at once to form a via hole 16 (FIG. 3D), and patterning for an interconnection groove is conducted using the photoresist film 15 (FIG. 3E). Next, the cap oxidation film 14 and the low-k film 13 are etched. Thereafter, the photoresist 15 is removed by ashing. Next, the silicon nitride film (diffusion-preventing film) 11 is etched to form an interconnection groove 17 (FIG. 3F). Then, a metal embedding Cu interconnection layer (second interconnection; not shown) is formed in the via hole 16 and the interconnection groove 17. Thereafter, this process is repeated to form multilayer interconnection.

In the present embodiment, the first embodiment is applied as a plasma etching method when the cap oxidation layer 14 and the low-k film 13 are etched together at once to form the via hole 16 (FIG. 3C). Thus, the generation of a trench in the hole pattern bottom portion of the low-k film 13 is suppressed, the pattern shape is stable and there is no loss of the diffusion-preventing barrier metal in the pattern. Therefore, short circuits with adjacent interconnection resulting from copper diffusion and the influence on a transistor can be considerably reduced.

Also, in the present embodiment, the first embodiment is applied as a plasma etching method when the cap oxidation layer 14, the low-k film 13 and the silicon nitride film (diffusion-preventing film) 11 are etched to form the interconnection groove 17 (FIG. 3F). As mentioned above, in the first embodiment, the evenness of the reaction product deposited at the pattern bottom portion is improved by raising pressure during etching, ions reflected by the side wall can be deterred from concentrating at the hole pattern bottom end portion by lowering RF power, and the etching speeds at the interconnection groove 17 bottom portion center and end portion become constant. Thus, it becomes possible to control the depth of the interconnection groove 17 without using an etch stop layer. Therefore, it becomes possible to form a damascene structure without an etching stopper, and interconnection capacity can be considerably reduced in comparison to the conventional dual damascene structure using a silicon nitride film or a silicon oxide film having a high dielectric constant for portion under the interconnection groove 17.

It should be noted that the above embodiments should be construed to limit the present invention. An embodiment can be realized as far as satisfying the requirements of the invention.

As described above, the invention provides an etching method where stabilization of the etching shape of a low-k film is improved and a semiconductor device fabricating method using this etching method.

What is claimed is:

1. A semiconductor device fabricating method comprising the steps of:
   forming a first interconnection;
   forming a low-k film as an interlayer insulating film over the first interconnection;
   forming a contact hole for electrically connecting the first interconnection and a second interconnection, in the interlayer insulating film comprising the low-k film; and
   forming an interconnection groove for embedding the second interconnection in the interlayer insulating film comprising the low-k film,
   wherein, in at least one of the hole forming step and the interconnection groove forming step, plasma etching is conducted under a gas atmosphere including a fluorocarbon gas, $O_2$ gas and Ar gas, and under the conditions of a pressure of 60 mTorr (7999.32 mPa) or higher and a high-frequency output (RF power) of 600 W or less, and
   wherein an etch stop layer is not formed in the interlayer insulating film comprising the low-k film.

2. The semiconductor device fabricating method of claim 1, wherein the fluorocarbon gas includes at least one selected from the group consisting of $C_4F_8$, $C_5F_8$, $C_4F_6$ and $C_3F_6$.

3. The semiconductor device fabricating method of claim 1, wherein the low-k film is one selected from the group consisting of an organic SOG film, an SiOC film and a pure organic film.

4. The semiconductor device fabricating method of claim 1, wherein a ratio of $O_2$ to a combined amount of the fluorocarbon gas and $O_2$ is 20 to 50%.

5. The semiconductor device fabricating method of claim 1, wherein, in both of the hole forming step and the interconnection groove forming step, plasma etching is conducted under a gas atmosphere including a fluorocarbon gas, $O_2$ gas and Ar gas, and under the conditions of a pressure of 60 mTorr (7999.32 mPa) or higher and a high-frequency output (RF power) of 600 W or less.

6. A method for fabricating a semiconductor device, comprising the steps of:
   (a) forming a layer having an interconnection element in it;
   (b) depositing a diffusion preventing film on the layer formed in step (a);
   (c) depositing a low-k interlayer insulating film on the diffusion preventing film, wherein the interlayer insulating film does not include an etch stop layer;
   (d) conducting a first etching procedure to form a via hole that extends through the interlayer insulating film but not through the diffusion preventing film; and
   (e) conducting a second etching procedure to form an interconnection groove that intersects an upper portion of the via hole, the second etching procedure additionally extending a bottom portion of the via hole through the diffusion preventing film and to the interconnection element,
   wherein at least one of the first and second etching procedures comprises plasma etching conducted under a gas atmosphere including a fluorocarbon gas, $O_2$ gas and Ar gas, and under the conditions of a pressure of 60 mTorr (7999.32 mPa) or higher and a high-frequency output (RF power) of 600 W or less.

7. The method of claim 6, wherein the diffusion preventing film deposited in step (b) is a first diffusion preventing film, and further comprising depositing a second diffusion preventing film on the interlayer insulating film and depositing a photoresist film on the second diffusion film before step (d) is conducted.

8. The method of claim 7, wherein the first etching procedure etches an aperture through the second diffusion preventing film, and further comprising depositing another photoresist film on the second diffusion preventing film before step (e) is conducted.

9. The method of claim 6, wherein the fluorocarbon gas includes at least one gas selected from the group consisting of $C_4F_8$, $C_5F_8$, $C_4F_6$, and $C_3F_6$.

10. The method of claim 6, wherein the low-k film is selected from the group consisting of an organic SOG film, an SiOC film, and a pure organic film.

11. The method of claim 6, wherein a ratio of $O_2$ to a combined amount of the fluorocarbon gas and $O_2$ is 20 to 50%.

12. The method of claim 6, wherein both of the first and second etching procedures comprise plasma etching conducted under a gas atmosphere including a fluorocarbon gas, $O_2$ gas and Ar gas, and under the conditions of a pressure of 60 mTorr (7999.32 mPa) or higher and a high-frequency output (RE power) of 600 W or less.

13. The method of claim 6, wherein the diffusion preventing film deposited in step (b) is a silicon nitride film.

14. The method of claim 1, further comprising the step of forming a diffusion prevention film on the first interconnection before conducting the step of forming a low-k film as an interlayer film over the first interconnection, and wherein an etch stop layer in not formed between the interlayer insulating film and the diffusion prevention film.

* * * * *